United States Patent
Ding et al.

(10) Patent No.: US 9,153,725 B2
(45) Date of Patent: Oct. 6, 2015

(54) SOLAR CELL AND MANUFACTURING METHOD THEREOF

(71) Applicant: NEO SOLAR POWER CORP., Hsinchu (TW)

(72) Inventors: Jau-Min Ding, Hsinchu (TW); Hsin-Chiao Luan, Hsinchu (TW); Kun-Chih Lin, Hsinchu (TW); Chih-Hung Liao, Hsinchu (TW); Yi-Wen Tseng, Hsinchu (TW)

(73) Assignee: NEO SOLAR POWER CORP., Hsinchu (TW)

( * ) Notice: Subject to any disclaimer, the term of this patent is extended or adjusted under 35 U.S.C. 154(b) by 0 days.

(21) Appl. No.: 14/465,328

(22) Filed: Aug. 21, 2014

(65) Prior Publication Data
US 2015/0179858 A1 Jun. 25, 2015

(30) Foreign Application Priority Data
Dec. 25, 2013 (TW) .............................. 102148312 A (51) Int. Cl.
*H01L 31/077* (2012.01)
*H01L 31/0376* (2006.01)
*H01L 31/0368* (2006.01)
*H01L 31/0224* (2006.01)
*H01L 31/0236* (2006.01)
*H01L 31/18* (2006.01)

(52) U.S. Cl.
CPC ........ *H01L 31/077* (2013.01); *H01L 31/02363* (2013.01); *H01L 31/022475* (2013.01); *H01L 31/03682* (2013.01); *H01L 31/03762* (2013.01); *H01L 31/1804* (2013.01); *H01L 31/1884* (2013.01)

(58) Field of Classification Search
CPC ...................................................... H01L 31/077
USPC .......................................................... 438/107
See application file for complete search history.

(56) References Cited

U.S. PATENT DOCUMENTS

2009/0020149 A1* 1/2009 Woods et al. ................. 136/244

* cited by examiner

*Primary Examiner* — Anthony Ho
(74) *Attorney, Agent, or Firm* — Muncy, Geissler, Olds & Lowe, P.C.

(57) ABSTRACT

A solar cell includes a crystalline silicon semiconductor substrate, an intrinsic amorphous silicon semiconductor layer, an amorphous silicon semiconductor layer and a transparent conductive layer. The crystalline silicon semiconductor substrate possesses a first doped type and a trench is formed thereon to form an enclosed area to define a first electrode region in the enclosed area and a second electrode region out of the enclosed area. The intrinsic amorphous silicon semiconductor layer, the amorphous silicon semiconductor layer and the transparent conductive layer are formed sequentially on the crystalline silicon semiconductor substrate and in the trench. Having discontinuity in the trench, the amorphous silicon semiconductor layer, the amorphous silicon semiconductor layer and the transparent conductive layer provide an isolation function between the previously defined first and second electrode regions.

21 Claims, 8 Drawing Sheets

SOLAR CELL AND MANUFACTURING METHOD THEREOF

CROSS-REFERENCES TO RELATED APPLICATIONS

This non-provisional application claims priority under 35 U.S.C. §119(a) on Patent Application No. 102148312 filed in Taiwan, R.O.C. on 2013 Dec. 25, the entire contents of which are hereby incorporated by reference.

BACKGROUND

1. Technical Field

The disclosure relates to a solar cell with a trench structure for isolation function and manufacturing method thereof, and particularly to a hetero junction silicon crystalline solar cell and manufacturing method thereof.

2. Related Art

Due to the increasing demand for eco-friendly electricity sources, electricity is no longer merely supplied from main electricity suppliers (such as thermal power generation, nuclear power generation, etc.). Alternative kinds of clean energy have been increasingly focused on. In comparison with other types of energy, solar energy has a higher electricity generation efficiency and broader applicability; consequently, the development of various kinds of solar cells has been increasingly and continuously making breakthroughs.

Among the various kinds of solar cells, the tandem structure solar cell optimizes its photoelectric conversion efficiency by combining materials with different energy gaps, thus performing higher photoelectric conversion efficiency. As compared to a conventional silicon based solar cell, the hetero junction silicon crystalline solar cell includes an intrinsic amorphous silicon semiconductor/P-type semiconductor layer (i/p layer), and an intrinsic amorphous silicon semiconductor/N-type semiconductor layer (i/n layer), which are very thin and respectively grown on the two surfaces of the crystalline silicon semiconductor substrate of the hetero junction silicon crystalline solar cell. The hetero junction silicon crystalline solar cell possesses advantages of simple structure, high open circuit voltage, applicable to thin substrate, low manufacturing temperature, etc.

The manufacturing process of the conventional hetero junction silicon crystalline solar cell is described briefly here. Firstly, intrinsic amorphous silicon semiconductor layer with thickness thereof smaller than 10 nanometers is grown on the crystalline silicon semiconductor substrate using plasma enhanced chemical vapor deposition (PECVD), and is provided for passivation. Then, an amorphous silicon semiconductor layer of a thickness less than 20 nanometers is formed on the intrinsic amorphous silicon semiconductor layer; the conductive type of the amorphous silicon semiconductor layer is different from that of the crystalline silicon semiconductor substrate, thus forming p-n junctions. Finally, vacuum evaporation is applied to manufacture the transparent layer and the front and back electrodes, thereby accomplishing the manufacturing of the hetero junction silicon crystalline solar cell.

However, during the vacuum evaporation the coating formed on the front surface of the solar cell contacts with the coating formed on the back surface of the solar cell, leading to short circuits; as a result, an insulating process is applied to keep the front electrode from being connected electrically to the back electrode. Conventionally, after the vacuum evaporation process, a laser beam is applied to form a trench on the solar cell to solve the short circuit issue; nevertheless, upon application of the laser beam, the instant high energy provided by the laser beam may induce the amorphous silicon semiconductor layer to become microcrystallized, thereby resulting in a further severe short circuit issue and reducing photoelectric conversion efficiency.

SUMMARY

In view of this, the disclosure provides a solar cell including a crystalline silicon semiconductor substrate, an intrinsic amorphous silicon semiconductor layer, an amorphous silicon semiconductor layer and a transparent conductive layer. The crystalline silicon semiconductor substrate possesses a first doped type and includes a trench configured thereon. The trench forms an enclosed area; a first electrode region is defined as the region in the enclosed area, and a second electrode region is defined as the region out of the enclosed area. The intrinsic amorphous silicon semiconductor layer is formed on the crystalline silicon semiconductor substrate and in the trench. The amorphous silicon semiconductor layer possesses a second doped type and is formed on the intrinsic amorphous silicon semiconductor layer and in the trench. The transparent conductive layer is formed on the amorphous silicon semiconductor layer. Specifically, the intrinsic amorphous silicon semiconductor layer, the amorphous silicon semiconductor layer, and the transparent conductive layer, are formed sequentially on the crystalline silicon semiconductor substrate and in the trench. The semiconductor layers and the transparent conductive layer form discontinuous laminar structure in the trench, thereby allowing the first electrode region and the second electrode region to be isolated from each other.

The disclosure further provides a manufacturing method for solar cell. The manufacturing method includes providing a crystalline silicon semiconductor substrate with a first doped type; forming a trench on a first surface of the crystalline silicon semiconductor substrate, wherein the trench forms an enclosed area to define a first electrode region in the enclosed area and a second electrode region out of the enclosed area; forming an intrinsic amorphous silicon semiconductor layer on the first surface of the crystalline silicon semiconductor substrate and in the trench; forming an amorphous silicon semiconductor layer on the intrinsic amorphous silicon semiconductor layer and in the trench; and forming a transparent conductive layer on the amorphous silicon semiconductor layer and in the trench.

The disclosure yet further provides a solar cell including a crystalline silicon semiconductor substrate with a first doped type, an intrinsic amorphous silicon semiconductor layer, an amorphous silicon semiconductor layer and a transparent conductive layer. At least one surface of the crystalline silicon semiconductor substrate includes a trench and a separating structure configured thereon. The trench and the separating structure define a first electrode region and a second electrode region on the surface of the crystalline silicon semiconductor substrate, wherein the first electrode region is isolated from the second electrode region at least through the trench. The intrinsic amorphous silicon semiconductor layer is formed on the crystalline silicon semiconductor substrate and in the trench. The amorphous silicon semiconductor layer possesses a second doped type and is formed on the intrinsic amorphous silicon semiconductor layer and in the trench. The transparent conductive layer is formed on the amorphous silicon semiconductor layer and in the trench. Consequently, the intrinsic amorphous silicon semiconductor layer, the amorphous silicon semiconductor layer and the transparent conductive layer are formed sequentially on the crystalline silicon semiconductor substrate and in the trench. The semiconductor layers and the transparent conductive layer form discontinuous laminar structure in the trench, thereby allowing the first electrode region and the second electrode region to be isolated from each other.

As described previously, by applying suitable parameters, a trench with proper width-depth ratio is formed on the C—Si substrate, thereby allowing the first electrode region and the second electrode region to be isolated from each other and protecting the solar cell from short circuits. Additionally, since the laser beam is only applied on the C—Si substrate, the a-Si layer is not microcrystallized as in the conventional case.

The detailed features and advantages of the disclosure are described below in great detail through the following embodiments, the content of the detailed description is sufficient for those skilled in the art to understand the technical content of the disclosure and to implement the disclosure there accordingly. Based upon the content of the specification, the claims, and the drawings, those skilled in the art can easily understand the relevant objectives and advantages of the disclosure.

BRIEF DESCRIPTION OF THE DRAWINGS

The disclosure will become more fully understood from the detailed description given herein below for illustration only and thus not limitative of the disclosure, wherein.

DETAILED DESCRIPTION

Please refer to FIG. 1 to FIG. 6, which are a schematic plan view, a schematic cross sectional view, and partial enlarged section views of a solar cell 100 of a first embodiment of the disclosure. The solar' cell 100 of the first embodiment includes a crystalline silicon semiconductor substrate 10 (hereafter, abbreviated C—Si substrate 10), an intrinsic amorphous silicon semiconductor layer 20 (hereafter, abbreviated i-a-Si layer 20), an amorphous silicon semiconductor layer 30 (hereafter, abbreviated a-Si layer 30), and a transparent conductive layer 40 (hereafter, abbreviated TCO layer 40), wherein the solar cell 100 possesses hetero-junctions.

Figure 1:
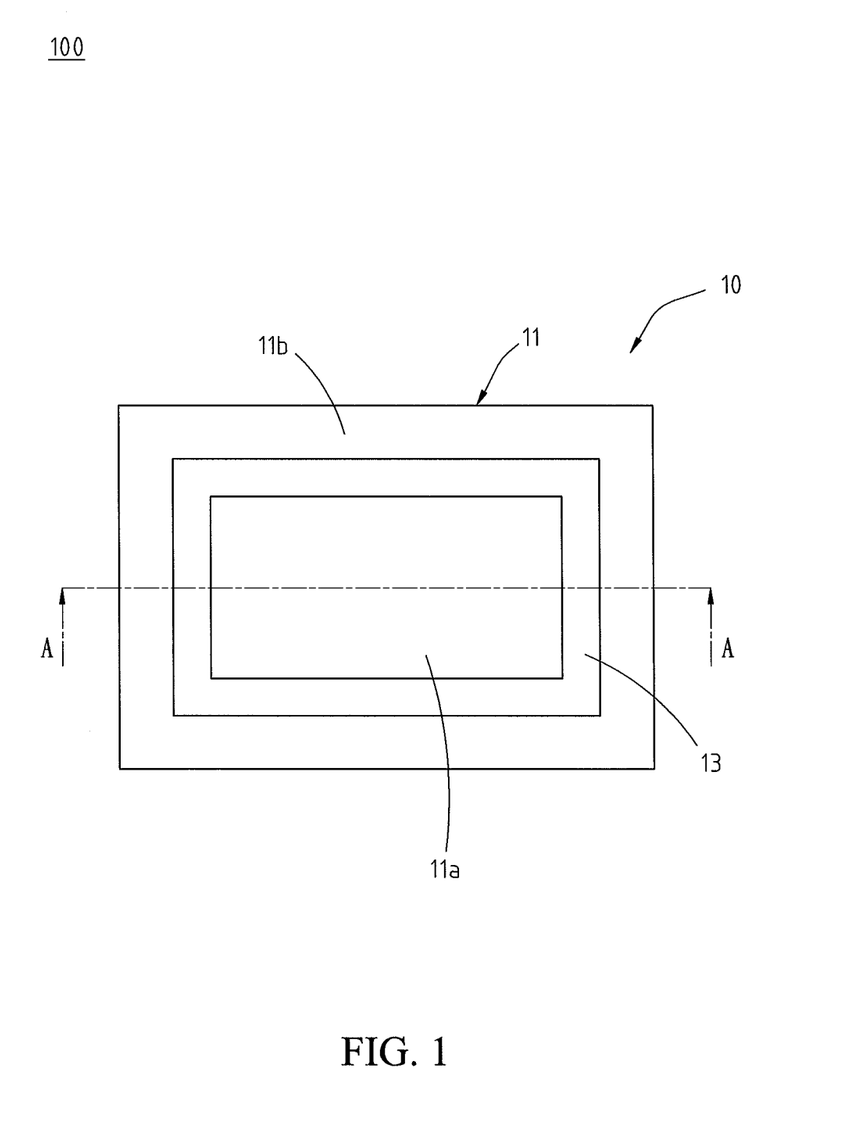
FIG. 1 is a schematic plan view of a solar cell of a first embodiment of the disclosure.
Figure 2:
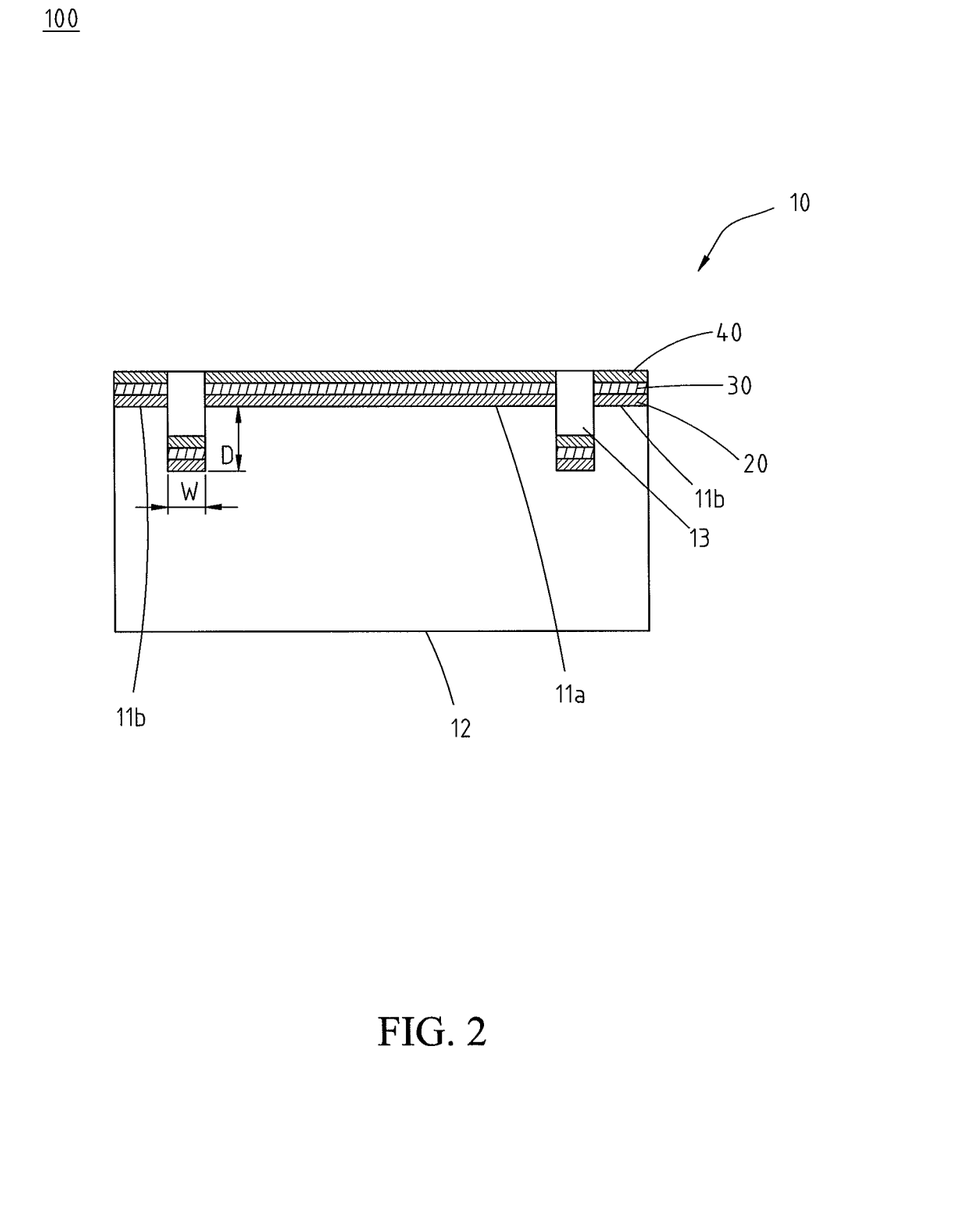
FIG. 2 is a schematic cross sectional view along line A-A shown in FIG. 1.

Please refer to FIG. 1 and FIG. 2, in which the C—Si substrate 10 includes a first doped type; that is, the C—Si substrate 10 is a P-type doped C—Si substrate or an N-type doped C—Si substrate. The N-type doped C—Si substrate is manufactured by mixing silicon wafers obtained from Floating zone method (FZ method), or Czochralski pulling method (CZ method), with N-type dopants; similarly, the P-type doped C—Si substrate is manufactured by mixing the silicon wafers with P-type dopants. In this embodiment, the C—Si substrate 10 is a P-type C—Si substrate. The C—Si substrate 10 includes a first surface 11 and a second surface 12; in this embodiment, the first surface 11 is provided for forming the i-a-Si layer 20, the a-Si layer 30, the TCO layer 40 and the front electrodes (not shown), and the second surface 12 is provided for configuring the back electrodes (not shown).

As shown in FIG. 1 and FIG. 2, the C—Si substrate 10 includes a trench 13 formed on the first surface 11 thereof, and the trench 13 divides the first surface 11 into a first electrode region 11a and a second electrode region 11b. More specifically, the trench 13 forms an enclosed area (for example, the enclosed area formed by the trench 13 is a rectangle, as shown in FIG. 1), on the first surface 11 of the C—Si substrate 10 to define the first electrode region 11a in the enclosed area and a second electrode region 11b out of the enclosed area. Here, the first electrode region 11a corresponds to the front electrodes, and the second electrode region 11nb corresponds to the back electrodes. The trench 13 is formed, for example, by laser cutting techniques so as to possess a better preciseness. Specifically, the trench 13 is formed on the C—Si substrate 10 by applying laser beams on the C—Si substrate 10. Additionally, with automatic or manual operating means, enclosed areas with different shapes are optionally carved on the C—Si substrate 10 to adjust the relative sizes and shapes between the first electrode region 11a and the second electrode region 11b. The depth D of the trench 13 is determined by the laser power, the laser frequency, the scanning speed and other factors. In this embodiment, the depth D of the trench 13 is 40 micrometers; in some implementation aspects, the depth D of the trench 13 is defined between 10 micrometers to 100 micrometers. Similarly, the width W of the trench 13 is determined not only by laser power, laser processing time, but also by the width of the laser beams. Consequently, since the depth D of the trench 13 is larger than a summation of thicknesses of the i-a-Si layer 20, the a-Si layer 30 and the TCO layer 40, the i-a-Si layer 20, the a-Si layer 30 and the TCO layer 40 cannot form continuous laminar structures on the side walls 131, 132 and the bottom 133 of the trench 13 upon forming the i-a-Si layer 20, the a-Si layer 30 and the TCO layer 40, thereby, among the i-a-Si layer 20, the a-Si layer 30 and the TCO layer 40, at least the TCO layer 40 forming discontinuous deposition structure on the trench 13. As a result, the first electrode region 11a is not connected electrically to the second electrode region 11b and is isolated from the second electrode region 11b.

Figure 3:
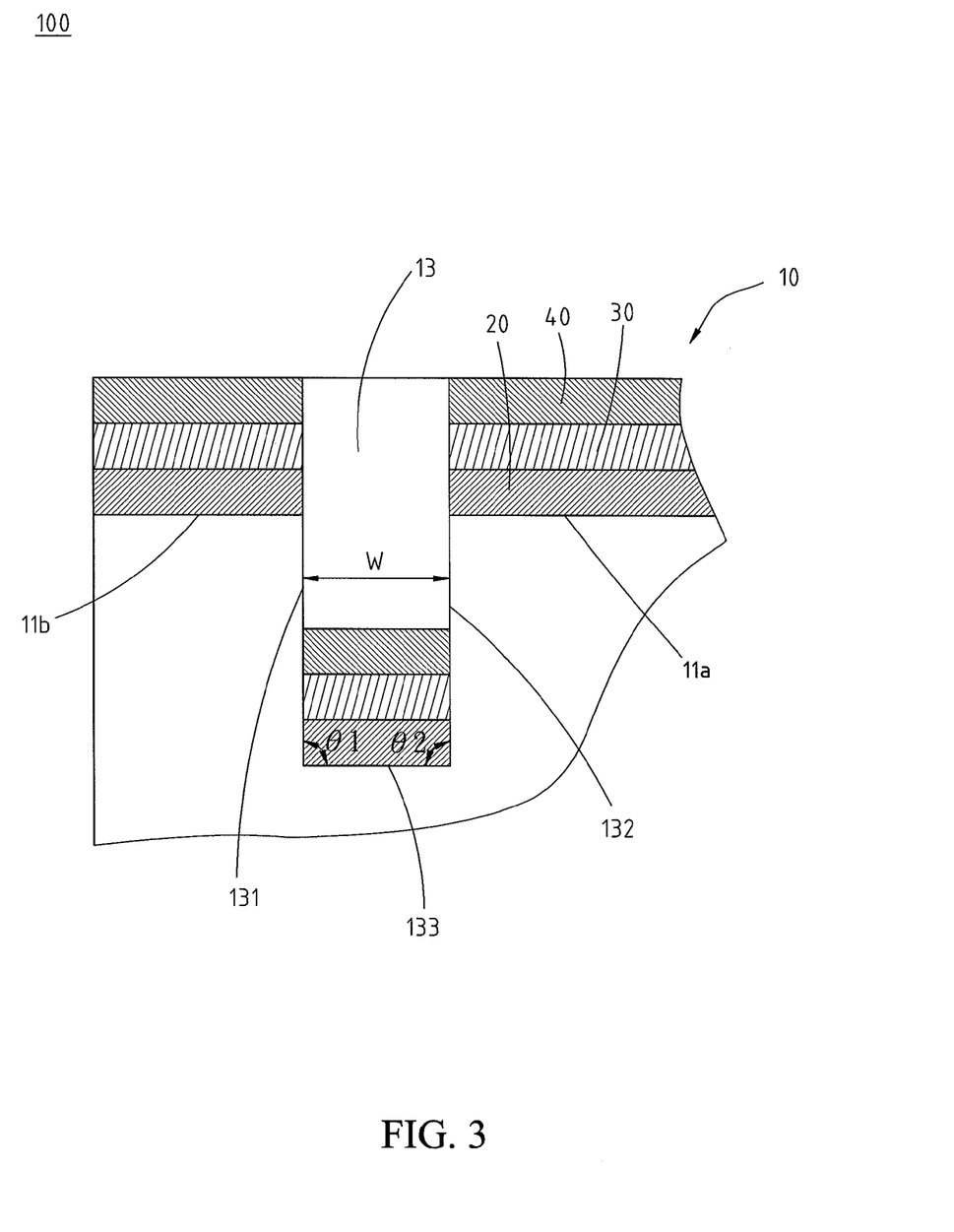
FIG. 3 is a partial enlarged section view (1) of the solar cell of the first embodiment of the disclosure.

Please refer to FIG. 3, in which the trench 13 includes a first side wall 131, a second side wall 132 and a bottom 133. The first side wall 131 and the second side wall 132 are opposite to each other. A first tilt angle $\theta_1$ is defined between the first side wall 131 and the bottom 133, and a second tilt angle $\theta_2$ is defined between the second side wall 132 and the bottom 13. It is understood that the angle mentioned hereafter is the internal angle but not the external angle; and, the tilt angles $\theta_1$, $\theta_2$ are defined by the bottom 133 and the first and second side walls 131, 132, therefore, the tilt angles $\theta_1$, $\theta_2$ must larger than 0 degree. In this embodiment, the first tilt angle $\theta_1$ and the second tilt angle $\theta_2$ are both 90 degrees. In some implementation aspects, when the first tilt angle $\theta_1$ is not larger than 90 degrees, the second tilt angle $\theta_2$ is smaller than 180 degrees; while in some further implementation aspects, when the first tilt angle $\theta_1$ is larger than 90 degrees, the second tilt angle $\theta_2$ is not larger than 90 degrees. Specifically, the width D of the trench 13 means the minimum distance between the first side wall 131 and the second side wall 132; and the first side wall 131 is not always parallel to the second side wall 132. The following paragraphs are provided to describe different implementation aspects of the trench 13.

Please refer to FIG. 3, in which the i-a-Si layer 20 is formed on the C—Si layer 10 and in the trench 13, thereby providing a passivation effect to reduce the surface carrier recombination velocity. It is understood that although the figure shows that the i-a-Si layer 20 is formed on the bottom 133 of the trench 13, but embodiments are not limited thereto; in some implementation aspects, the i-a-Si layer 20 is formed on the first side wall 131 (or second side wall 132), and the bottom 133 of the trench 13 simultaneously, but the i-a-Si layer 20 is never formed on the first side wall 131, the second side wall 132 and the bottom 133 simultaneously. The i-a-Si layer 20 is formed on the C—Si substrate 10 and in the trench 13 using plasma enhanced chemical vapor deposition (PECVD), but embodiments are not limited thereto; in some implementation aspects, the i-a-Si layer 20 is formed using sputtering coating method or chemical vapor deposition (CVD), technique. In this embodiment, the thickness of the i-a-Si layer 20 is smaller than 10 nanometers.

Please refer again to FIG. 3, in which the a-Si layer 30 is formed on the i-a-Si layer 20 and in the trench 13, and the a-Si layer 30 includes a second doped type; that is, in this embodiment, the a-Si layer 30 is a P-type doped a-Si layer. Again, it is understood that although the figure shows that the a-Si layer 30 is formed on the bottom 133 of the trench 13, but embodiments are not limited thereto; in some implementation aspects, depended on the shape and the depth of the trench 13, the a-Si layer 30 can be completely covered on the bottom 133 and the first side wall 131 (or the second side wall 132), of the trench 13; alternatively, the a-Si layer 30 is formed on parts of the bottom 133, the first side wall 131 and the second side wall 132, and rest parts of the bottom 133, the first side wall 131 and the second side wall 132 are not covered by the a-Si layer 30. Therefore, the a-Si layer 30 at least possesses discontinuous structures on the bottom 133, the first side wall 131 or the second side wall 132 of the trench 13, thereby achieving the isolation function. Similarly, the a-Si layer 30 is formed on the i-a-Si layer 20 and in the trench 13 by using PECVD, but not limited thereto; optionally, the a-Si layer 30 is formed using sputtering coating method, CVD or other techniques. In this embodiment, the thickness of the a-Si layer 30 is smaller than 20 nanometers.

Please refer to FIG. 3, in which the TCO layer 40 is formed on the a-Si layer 30 and in the trench 13. For example, the TCO layer 40 is an indium tin oxide layer (ITO layer), a fluorine-doped tin oxide layer (FTO layer), etc. The TCO layer 40 is conductive and allows light beams to pass through. It is understood that although the figure shows that the TCO layer 40 is only formed on the bottom 133 of the trench 13, but embodiments are not limited thereto; in some implementation aspects, the TCO layer 40 is formed on the first side wall 131 (or the second side wall 132), and the bottom 133 of the trench 13 simultaneously, but the TCO layer 40 is never formed on the first side wall 131, the second side wall 132 and the bottom 133 simultaneously.

As shown in FIG. 2 and FIG. 3, the first side wall 131 and the second side wall 132 of the trench 13 are parallel with each other, and the first tilt angle $\theta_1$ between the first side wall 131 and the bottom 133 is substantially equal to 90 degrees; that is, the bottom 133 is perpendicular to the first side wall 131 and the second side wall 132, and the first surface 11 of the C—Si substrate 10 is also perpendicular to the first side wall 131 and the second side wall 132, so that the sectional view of the trench 13 forms an oblong container, and the width of the opening of the trench 13 is equal to the width of the bottom 133 of the trench 13. Correspondingly, the aforementioned trench 13 can be obtained via applying the laser beam to cut the C—Si substrate 10 in a direction vertical to the first surface 11 of the C—Si substrate 10. Consequently, since the bottom 133 and the first surface 11 of the C—Si substrate 10 are both perpendicular to the first side wall 131 and the second side wall 132, upon forming the follow-up semiconductor layers (the i-a-Si layer 20 and the a-Si layer 30), and the TCO layer 40, the semiconductor layers and the TCO layer 40 can barely be formed or can only be formed discontinuously on the first side wall 131 and the second side wall 132, thus forming discontinuous semiconductor layers (namely, the i-a-Si layer 20 and the a-Si layer 30), and TCO layer 40 on the first side wall 131 and the second side wall 132, thereby achieving a great isolation function.

Figure 4:
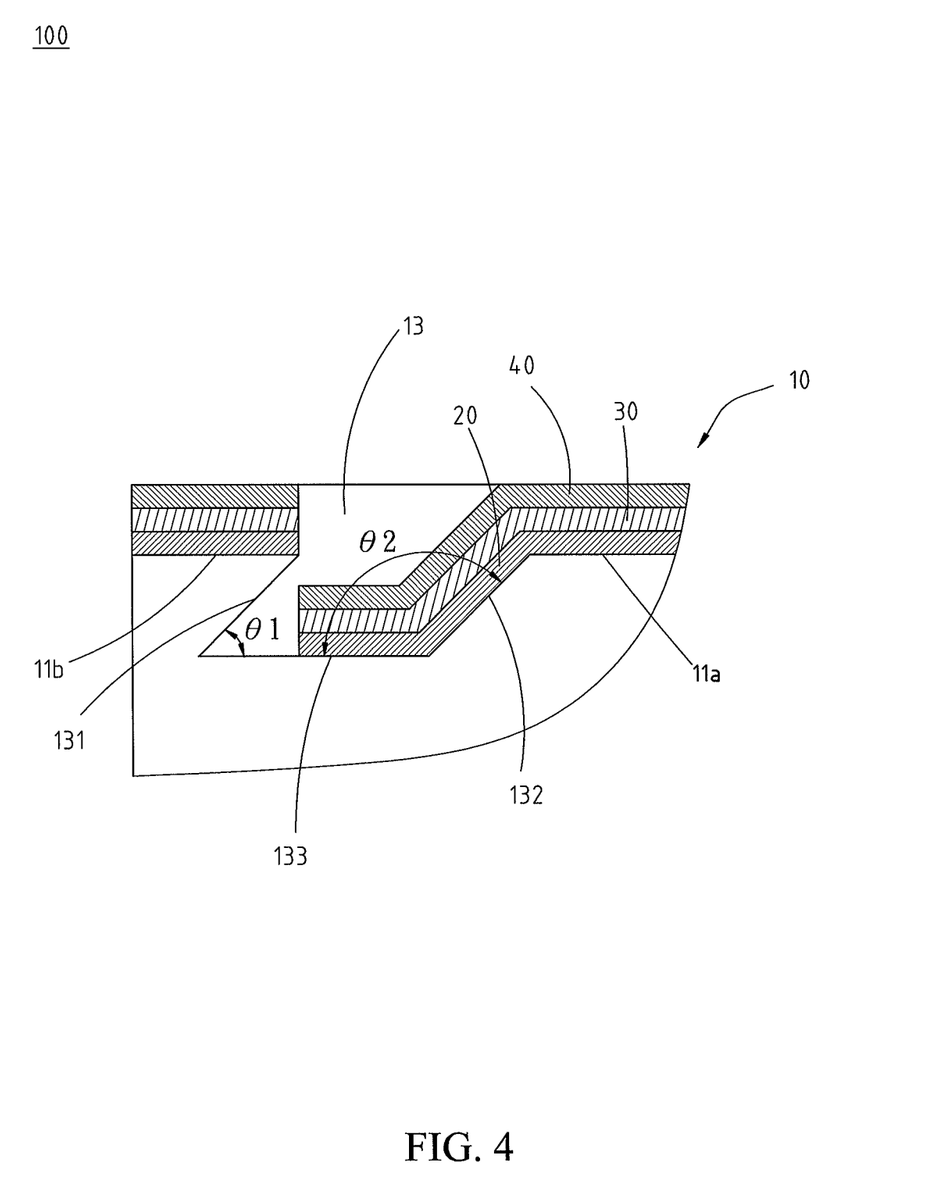
FIG. 4 is a partial enlarged section view (2) of the solar cell of the first embodiment of the disclosure.

As shown in FIG. 4, the first side wall 131 and the second side wall 132 of the trench 13 are parallel with each other; the first tilt angle $\theta_1$ is 45 degrees, and the first tilt angle $\theta_1$ is the supplementary angle of the second tilt angle $\theta_2$ (the angle defined between the second side wall 132 and the bottom 133); that is, the sectional view of the trench 13 forms a parallelogram container. In this embodiment, the first tilt angle $\theta_1$ is 45 degrees, but embodiments are not limited thereto. Correspondingly, the aforementioned trench 13 can be obtained via applying the laser beam to cut the C—Si substrate 10 with a tilt angle respect to the C—Si substrate 10. As shown in FIG. 4, in the follow-up depositing processes, although the semiconductor layers 20, 30 and the TCO layer 40 are deposited on the second side wall 132 and the bottom 133 of the trench 13 easily, the semiconductor layers 20, 30 and the TCO layer 40 can barely be deposited on the first side wall 131 due to the spatial hindrance provided by the shape of the trench 13, thereby achieving greater isolation.

Figure 5:
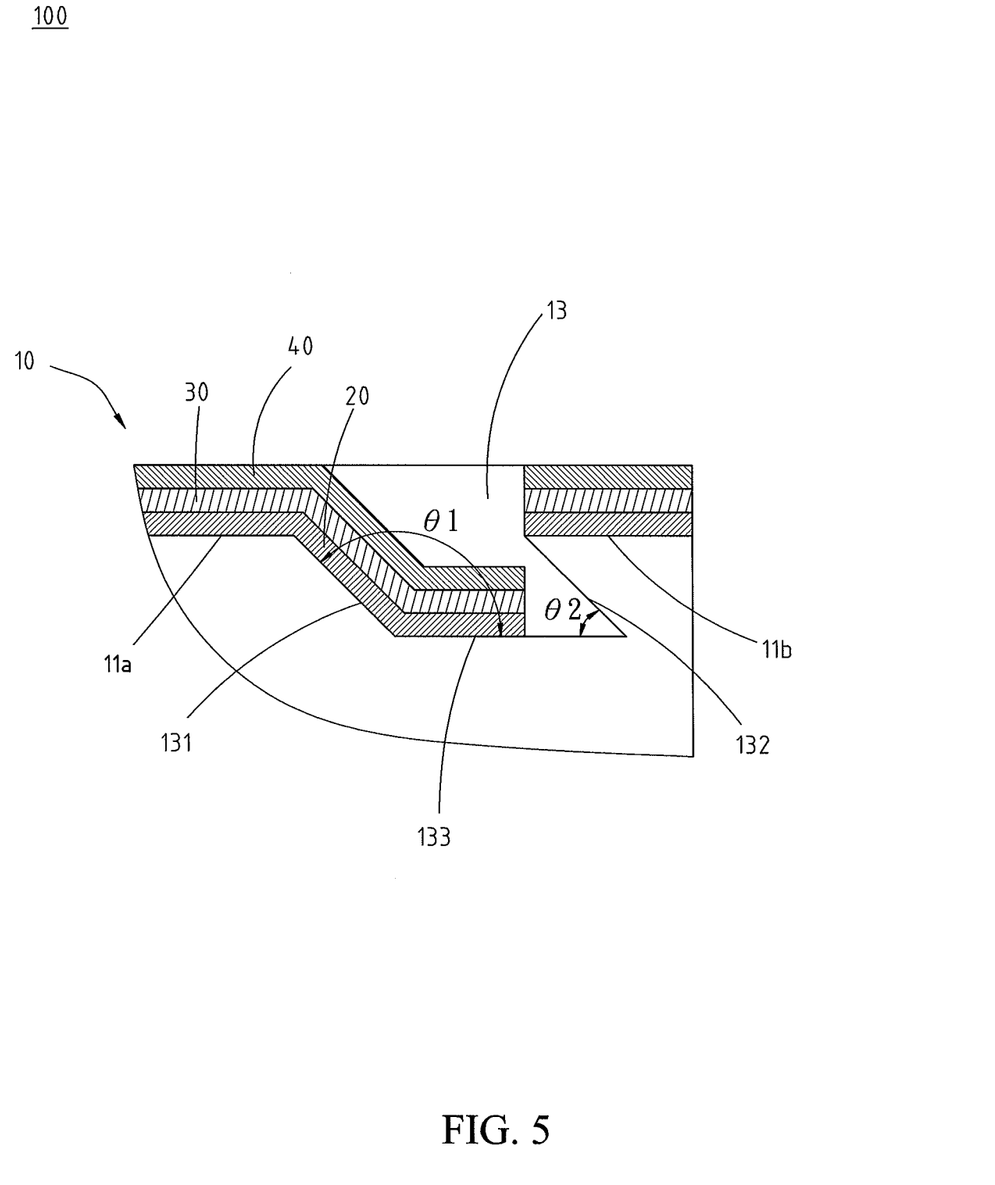
FIG. 5 is a partial enlarged section view (3) of the solar cell of the first embodiment of the disclosure.

As shown in FIG. 5, the first tilt angle $\theta_1$ (the angle defined between the first side wall 131 and the bottom 133), is 135 degrees, and the first side wall 131 is parallel to the second side wall 132 (the second tilt angle $\theta_2$ is 45 degrees). That is, the trenches 13 provided in FIG. 4 and provided in FIG. 5 are in mirror image symmetry. As shown in FIG. 5, in the follow-up depositing processes, although the semiconductor layers 20, 30 and the TCO layer 40 are deposited on the first side wall 131 and the bottom 133 of the trench 13 easily, the semiconductor layers 20, 30 and the TCO layer 40 can barely be deposited on the second side wall 132 due to the spatial hindrance provided by the shape of the trench 13, thereby achieving a great isolation function. In some implementation aspects, the first angle $\theta_1$ is not the supplementary angle of the second tilt angle $\theta_2$.

Figure 6:
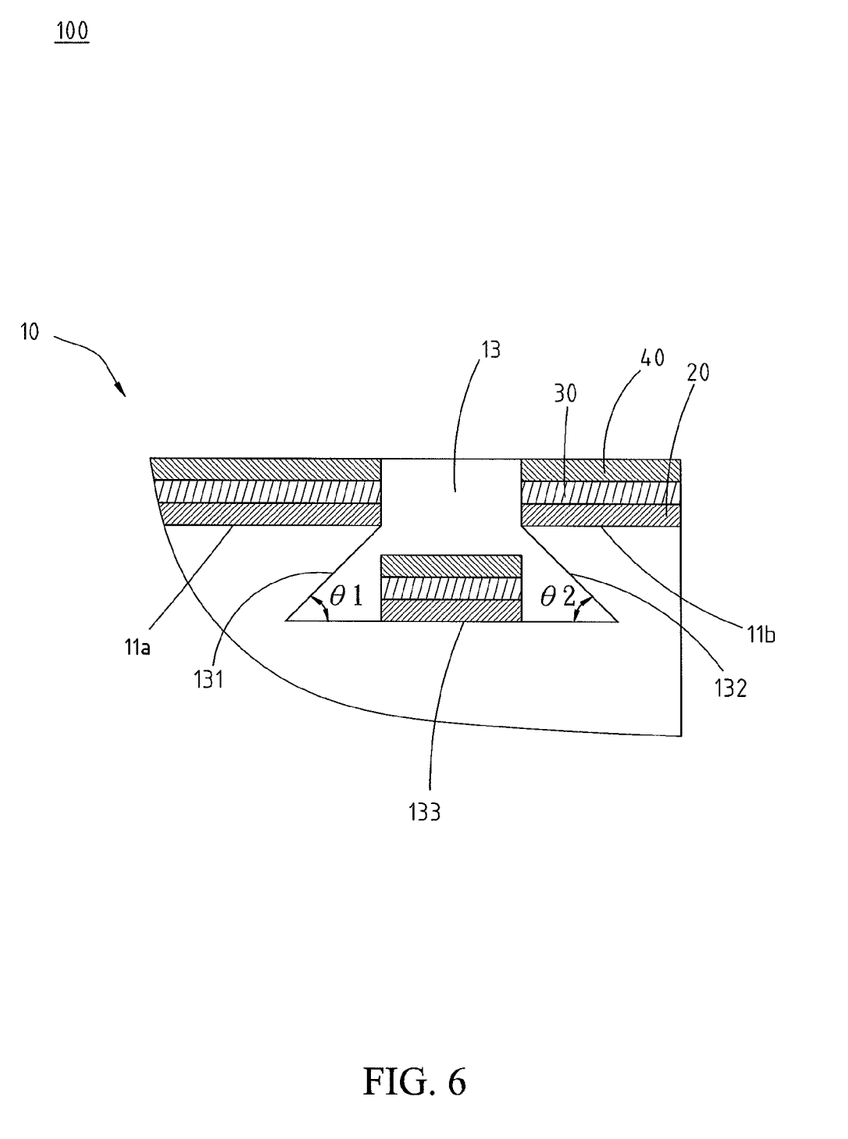
FIG. 6 is a partial enlarged section view (4) of the solar cell of the first embodiment of the disclosure.

As shown in FIG. 6, the first tilt angle $\theta_1$ and the second tilt angle $\theta_2$ are both 45 degrees; that is, the first tilt angle $\theta_1$ is equal to the second tilt angle $\theta_2$ and is not 90 degrees, so that the sectional view of the trench 13 forms an isosceles trapezoid. The topline of the trapezoid (the width of the opening of the trench 13), is smaller than the baseline of the trapezoid (the width of the bottom 133 of the trench 13); that is, the width of the opening of the trench 13 is smaller than the width of the bottom 133 of the trench 13. In this embodiment, both the first tilt angle $\theta_1$ and the second tilt angle $\theta_2$ are 45 degrees, but embodiments are not limited thereto. Correspondingly, the aforementioned trench 13 can be obtained via symmetrically applying the laser beam to cut the C—Si substrate 10 with a tilt angle respect to the C—Si substrate 10 for two times. As shown in FIG. 6, the semiconductor layers 20, 30 and the TCO layer 40 can barely b deposited on the first side wall 131 and the second side wall 132, due to the spatial hindrance provided by the shape of the trench 13, thereby achieving a great isolation function. It is understood that, Additionally the implementation provided in the figures, the sectional view of the trench 13 can also form a trapezoid with right angle or an irregular quadrilateral, which is achieved by applying the laser beam to cut the C—Si substrate 10 for one time or multi times; for example, the trench 13 with a right-angle trapezoid sectional view is obtained via using the laser beam with a tilt angle respect to the C—Si substrate 10 and using the laser beam perpendicular to the C—Si 10, to cut the C—Si substrate 10.

Figure 7:
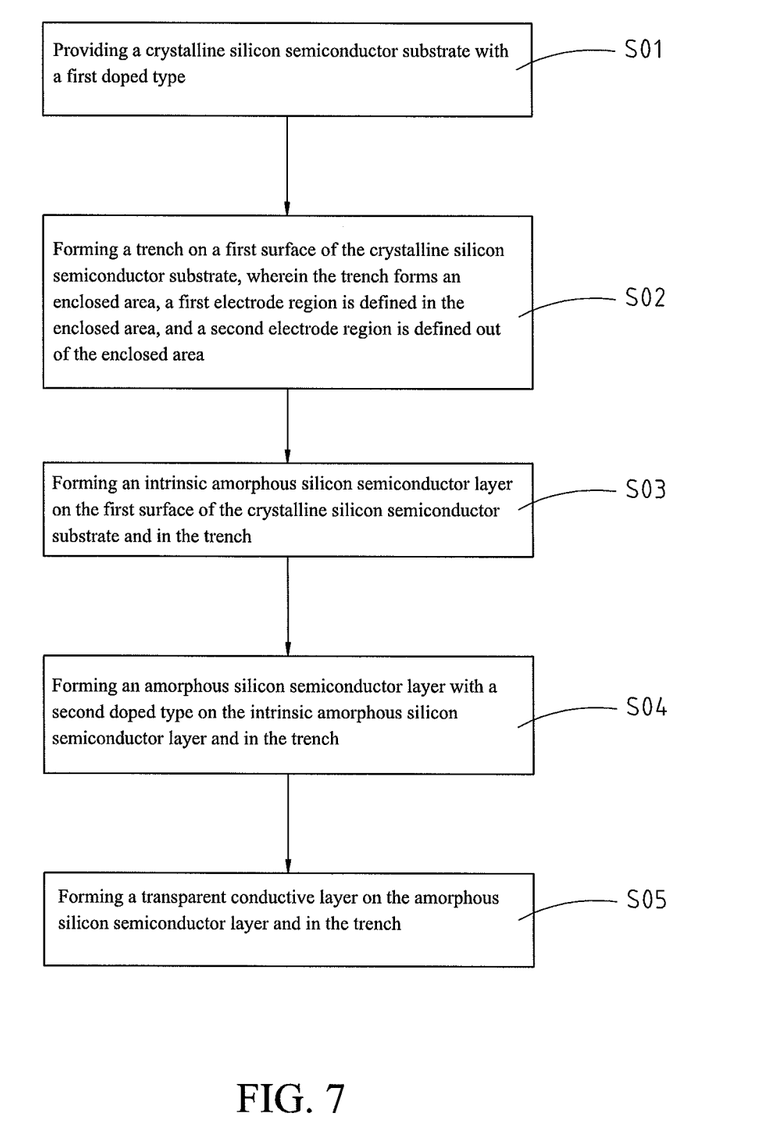
FIG. 7 is a schematic flow chart for showing a manufacturing method for solar cell of a second embodiment of the disclosure.

Please refer to FIG. 7, which is a schematic flow chart for showing a manufacturing method for solar cell of a second embodiment of the disclosure. The manufacturing method for solar cell includes following steps. Step S01: providing a crystalline silicon semiconductor substrate with a first doped type (hereafter, abbreviated C—Si substrate). Step S02: forming a trench on a first surface of the C—Si substrate, wherein the trench forms an enclosed area to divide the first surface of the C—Si substrate into a first electrode region and a second electrode region. Step S03: forming an intrinsic amorphous silicon semiconductor layer (hereafter, abbreviated i-a-Si layer) on the first surface of the C—Si substrate and in the trench. Step S04: forming an amorphous silicon semiconductor layer (hereafter, abbreviated a-Si layer) on the i-a-Si layer and in the trench. Step S05: forming a transparent conductive layer (hereafter, abbreviated TCO layer) on the a-Si layer and in the trench.

Please refer to FIG. 2 and FIG. 7, step S01 is providing a C—Si substrate 10 possessing a first doped type; as mentioned, the C—Si substrate 10 can be a P-type doped C—Si substrate or an N-type doped C—Si substrate. The manufacturing of the P-type (N-type) doped C—Si substrate is described in the preceding paragraphs and is not provided here. In this embodiment, the C—Si substrate 10 is an N-type doped C—Si substrate and includes a first surface 11 and a second surface 12. The first surface 11 is provided for forming the i-a-Si layer 20, the a-Si layer 30, the TCO layer 40 and the front electrodes (not shown), and the second surface 12 is provided for configuring the back electrodes (not shown).

Please refer to FIG. 2 and FIG. 7, the step S02 is forming a trench 13 on the first surface 11 of the C—Si substrate 10, wherein the trench 13 forms an enclosed area to divide the first surface 11 of the C—Si substrate 10 into a first electrode region 11a and a second electrode region 11b; that is, the first electrode region 11a is defined in the enclosed area, and the second electrode region 11b is defined out of the enclosed area. Here, the first electrode region 11a corresponds to the front electrodes and the second electrode region 11b corresponds to the back electrodes. In general, the trench 13 is formed by applying laser cutting techniques; the relationships between the parameter of the laser beam and the width W and depth D of the trench 13 is mentioned in the preceding paragraph and is not provided again. Similarly, as described, trenches 13 with different sectional profiles, such as a rectangle, a parallelogram, a trapezoid or an irregular quadrilateral can be formed by operating the cutting angle of the laser beam with respect to the C—Si substrate 10.

The step S03 is forming an i-a-Si layer 30 on the first surface 11 of the C—Si substrate 10 and in the trench 13. The i-a-Si layer 30 is provided for passivation and for reducing the surface carrier recombination velocity. Upon forming the i-a-Si layer 30, the existence of the trench 13 prevents the first electrode region 11a from connected electrically to the second electrode region 11b thereby protecting the solar cell from short circuits. That is, the i-a-Si layer 20 is formed on parts of the trench 13 (for example, as shown in FIG. 3, the i-a-Si layer 20 is formed on the bottom 133 of the trench 13), thereby allowing the first electrode region 11a and second electrode region 11b of the first surface 11 of the C—Si substrate 10 to be isolated from each other. The formation means and the thickness conditions of the i-a-Si layer 20 are described in the preceding paragraphs and are not provided here.

The step S04 is forming an a-Si layer 30 on the i-a-Si layer 20 and in the trench 13. The a-Si layer 30 possesses a second doped type; that is, in this embodiment, the a-Si layer 30 is a P-type doped a-Si layer. Similarly, upon forming the a-Si layer 30, again, the existence of the trench 13 prevents the first electrode region 11a from connected electrically to the second electrode region 11b thereby preventing from being short circuited. That is, the a-Si layer 30 is formed on parts of the trench 13 (for example, as shown in FIG. 3, the a-Si layer 30 is formed on the bottom 133 of the trench 13), thereby allowing the first electrode region 11a and the second electrode region 11b of the first surface 11 of the C—Si substrate 10 to be isolated from each other. The formation means and the thickness conditions of the a-Si layer 30 are described in the preceding paragraphs and are not provided here.

Please refer to FIG. 2 and FIG. 7, the step S05 is forming a TCO layer 40 on the a-Si layer 30 and in the trench 13. The TCO layer 40 is conductive and allows light beams to pass through. The material selection for the TCO layer 40 is mentioned above. Upon forming the TCO layer 40, the existence of the trench 13 prevents the first electrode region 11a from connected electrically to the second electrode region 11b thereby preventing from being short circuited. That is, the TCO layer 40 is formed on parts of the trench 13 (for example, as shown in FIG. 3, the TCO layer 40 is formed on the bottom 133 of the trench 13), thereby allowing the first electrode region 11a and the second electrode region 11b of the first surface 11 of the C—Si substrate 10 to be isolated from each other.

In some implementation aspects, the surface (the first surface 11 and/or the second surface 12), of the C—Si substrate 10 further includes a texture structure. The texture structure is formed by applying texturing process on the surface of the C—Si substrate 10, so that a plurality of protrusions and recessions are formed on the surface of the C—Si substrate 10. Additionally, the trench 13 and the texture structure can be configured on the same surface of the C—Si substrate 10 or on different surfaces of the C—Si substrate 10, respectively; alternatively, the trench 13 and the texture structure can be simultaneously configured on the two surfaces (the first surface 11 and the second surface 12), of the C—Si substrate 10. Similarly, when the trench 13 and the texture structure are formed on the same surface of the C—Si substrate 10, the depth D of the trench 13 is defined between 10 micrometers to 100 micrometers, and the depth D of the trench 13 is at least larger than the summation of thicknesses of the i-a-Si layer 20, the a-Si layer 30 and the TCO layer 40 to ensure that the semiconductor layers 20, 30 and the TCO layer 40 cannot form a continuous laminar structure on the side walls 131, 132 and the bottom 133 of the trench 13. In some implementation aspects, the depth D of the trench 13 is not smaller than a height of the texture structure at where the trench 13 is located, and the depth D of the trench 13 is larger than the summation of thicknesses of the i-a-Si layer 20, the a-Si layer 30 and the TCO layer 40, thereby providing better isolation. Consequently, when the C—Si substrate 10 of the solar cell is N-type doped, the trench 13 and the texture structure are respectively or simultaneously configured on the surface possessing the P-type doped a-Si layer or on the surface possessing the N-type doped a-Si layer; conversely, when the C—Si substrate 10 of the solar cell is P-type doped, the trench 13 and the texture structure are respectively or simultaneously configured on the surface possessing the N-type doped a-Si layer or on the surface possessing the P-type doped a-Si layer.

Based on the above, by applying suitable parameters, a trench 13 with proper width-depth ratio is formed on the C—Si substrate 10, thereby allowing the first electrode region 11a and the second electrode region 11b to be isolated from each other and protecting the solar cell 100 from short circuits. Additionally, since the laser beam is only applied on the C—Si substrate 10, the a-Si layer 30 is not microcrystallized as met in the conventional case.

Figure 8:
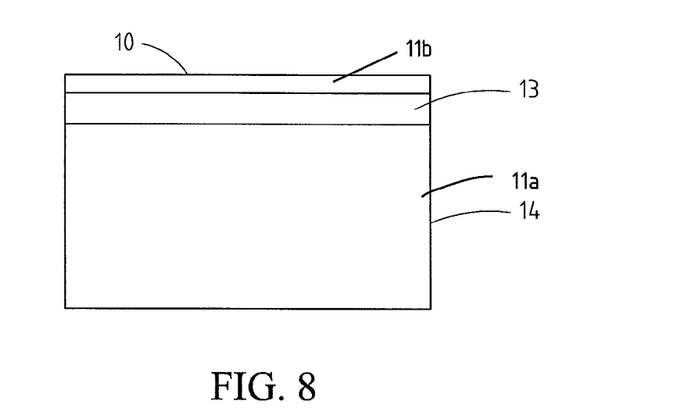
FIG. 8 is a schematic plan view (1) of a solar cell of a third embodiment of the disclosure.
Figure 9:
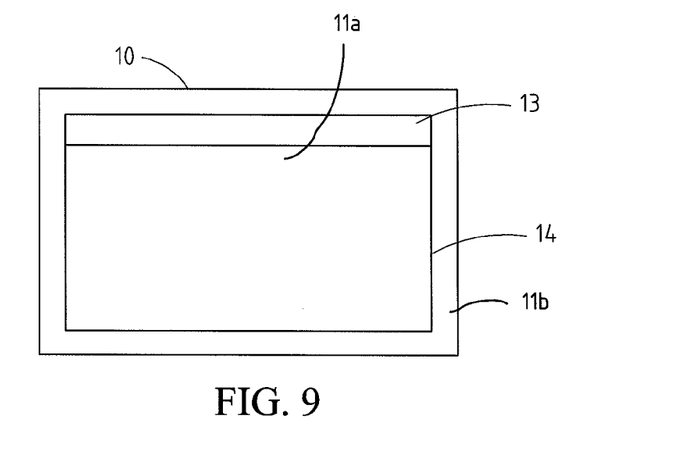
FIG. 9 is a schematic plan view (2) of a solar cell of a third embodiment of the disclosure.
Figure 10:
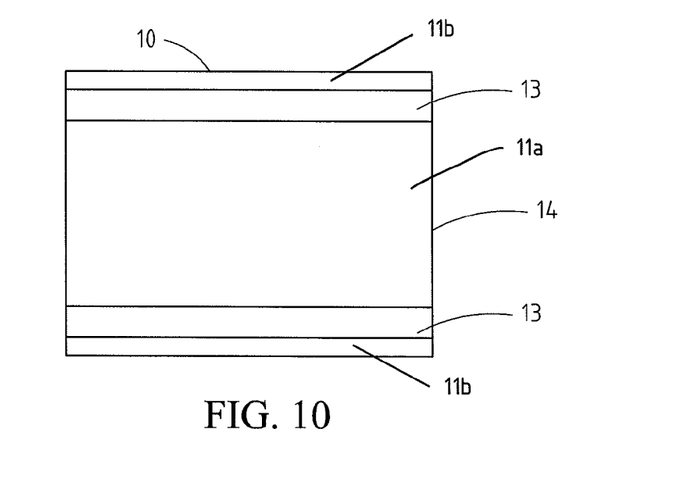
FIG. 10 is a schematic plan view (3) of a solar cell of a third embodiment of the disclosure.

Please refer to FIG. 8 to FIG. 10, which are schematic plan views of a solar cell of a third embodiment of the disclosure, respectively. The solar cell of the third embodiment is approximately the same as that of the first embodiment, except that, in the third embodiment, at least on surface of the C—Si substrate 10 includes a trench 13 and a separating structure 14 configured thereon, wherein the separating structure 14 is an opening or a fracture. The trench 13 and the separating structure 14 define the first electrode region 11a and the second electrode region 11b on the surface. The first electrode region 11a is isolated from the second electrode region 11b at least through the trench 13; as shown in FIG. 8 to FIG. 10, by using different configurations of the trench(es) 13 and the separating structure(s) 14, the first electrode region 11a is isolated from the second electrode region 11b. The separating structure 14 is formed by using laser beam or mask so as to form opening or section on the surface of the C—Si substrate 10, thereby the i-a-Si layer 20, the a-Si layer 30 and the TCO layer 40 forming discontinuous structure on the C—Si substrate 10.

While the disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A solar cell, comprising:
  a crystalline silicon semiconductor substrate with a first doped type and comprising a trench formed on at least one surface thereof, the trench formed an enclosed area to define a first electrode region in the enclosed area and a second electrode region out of the enclosed area;
  an intrinsic amorphous silicon semiconductor layer, formed on the crystalline silicon semiconductor substrate and in the trench;
  an amorphous silicon semiconductor layer with a second doped type, formed on the intrinsic amorphous silicon semiconductor; and
  a transparent conductive layer, formed on the amorphous silicon semiconductor layer;
  wherein a depth of the trench is larger than a summation of thicknesses of the intrinsic amorphous silicon semiconductor layer, the amorphous silicon semiconductor layer and the transparent conductive layer in the trench.

2. The solar cell according to claim 1, wherein the depth of the trench is defined between 10 micrometers to 100 micrometers.

3. The solar cell according to claim 1, wherein the first doped type is a P-type doped or an N-type doped.

4. The solar cell according to claim 3, wherein the second doped type is the P-type doped or the N-type doped.

5. The solar cell according to claim 1, wherein at least one surface of the crystalline silicon semiconductor substrate comprises a texture structure.

6. The solar cell according to claim 5, wherein the depth of the trench is not smaller than a height of the texture structure at where the trench is located.

7. The solar cell according to claim 1, wherein the trench comprises a first side wall, a second side wall and a bottom, the first side wall and the second side wall are opposite to each other, a first tilt angle is defined between the first side wall and the bottom, a second tilt angle is defined between the second side wall and the bottom.

8. The solar cell according to claim 7, wherein the first tilt angle is not larger than 90 degrees and the second tilt angle is smaller than 180 degrees.

9. The solar cell according to claim 7, wherein the first tilt angle is larger than 90 degrees and the second tilt angle is not larger than 90 degrees.

10. A manufacturing method for solar cell, comprising:
  providing a crystalline silicon semiconductor substrate with a first doped type;
  forming a trench on a surface of the crystalline silicon semiconductor substrate, wherein the trench forms an enclosed area to define a first electrode region in the enclosed area, and a second electrode region out of the enclosed area;
  forming an intrinsic amorphous silicon semiconductor layer on the crystalline silicon semiconductor substrate and in the trench;
  forming an amorphous silicon semiconductor layer with a second doped type on the intrinsic amorphous silicon semiconductor layer; and
  forming a transparent conductive layer on the amorphous silicon semiconductor layer;
  wherein a depth of the trench is larger than a summation of thicknesses of the intrinsic amorphous silicon semiconductor layer, the amorphous silicon semiconductor layer and the transparent conductive layer in the trench.

11. The manufacturing method for solar cell according to claim 10, wherein the depth of the trench is defined between 10 micrometers to 100 micrometers.

12. The manufacturing method for solar cell according to claim 10, wherein the first doped type is a P-type doped or an N-type doped.

13. The manufacturing method for solar cell according to claim 10, wherein the second doped type is the P-type doped or the N-type doped.

14. The manufacturing method for solar cell according to claim 10, wherein at least one surface of the crystalline silicon semiconductor substrate comprises a texture structure.

15. The manufacturing method for solar cell according to claim 14, wherein the depth of the trench is not smaller than a height of the texture structure at where the trench is located.

16. The manufacturing method for solar cell according to claim 10, wherein the trench comprises a first side wall, a second side wall and a bottom, the first side wall and the second side wall are opposite to each other, a first tilt angle is defined between the first side wall and the bottom, a second tilt angle is defined between the second side wall and the bottom.

17. The manufacturing method for solar cell according to claim 16, wherein the first tilt angle is not larger than 90 degrees and the second tilt angle is smaller than 180 degrees.

18. The manufacturing method for solar cell according to claim 16, wherein the first tilt angle is larger than 90 degrees and the second tilt angle is not larger than 90 degrees.

19. A solar cell, comprising:
- a crystalline silicon semiconductor substrate with a first doped type and comprising a trench and a separating structure configured on at least one surface thereof, the trench and the separating structure defining a first electrode region and a second electrode region, wherein the first electrode region is isolated from the second electrode region at least through the trench;
- an intrinsic amorphous silicon semiconductor layer, formed on the crystalline silicon semiconductor substrate and in the trench;
- an amorphous silicon semiconductor layer with a second doped type, formed on the intrinsic amorphous silicon semiconductor; and
- a transparent conductive layer, formed on the amorphous silicon semiconductor layer;
- wherein a depth of the trench is larger than a summation of thicknesses of the intrinsic amorphous silicon semiconductor layer, the amorphous silicon semiconductor layer and the transparent conductive layer in the trench.

20. The solar cell according to claim 19, wherein the first electrode region is isolated from the second electrode region through the trench and the separating structure.

21. The solar cell according to claim 19, wherein the separating structure is an opening or a fracture.

* * * * *